United States Patent
Chen et al.

(10) Patent No.: US 10,580,945 B2
(45) Date of Patent: *Mar. 3, 2020

(54) LED DEVICE

(71) Applicant: LEEDARSON LIGHTING CO. LTD., Zhangzhou, Fujian (CN)

(72) Inventors: Yanbiao Chen, Xiamen (CN); Liangliang Cao, Xiamen (CN); Huiwu Chen, Xiamen (CN); Qiyuan Wang, Xiamen (CN)

(73) Assignee: LEEDARSON LIGHTING CO. LTD., Zhangzhou, Fujian (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/055,778

(22) Filed: Aug. 6, 2018

(65) Prior Publication Data

US 2019/0221723 A1    Jul. 18, 2019

Related U.S. Application Data

(63) Continuation of application No. 15/892,358, filed on Feb. 8, 2018, now Pat. No. 10,069,047, which is a
(Continued)

(30) Foreign Application Priority Data

Jan. 16, 2018    (CN) ............... 2018 2 0071681 U

(51) Int. Cl.
*H01L 33/50*    (2010.01)
*H01L 25/075*    (2006.01)
(Continued)

(52) U.S. Cl.
CPC ........ *H01L 33/504* (2013.01); *H01L 25/0753* (2013.01); *H01L 33/486* (2013.01);
(Continued)

(58) Field of Classification Search
CPC ..... H01L 33/504; H01L 33/62; H01L 33/486; H01L 33/505; H01L 33/60; H01L 33/50;
(Continued)

(56) References Cited

U.S. PATENT DOCUMENTS

| | | | |
|---|---|---|---|
| 2009/0272996 A1* | 11/2009 | Chakraborty | ......... H01L 33/501 257/98 |
| 2011/0147775 A1* | 6/2011 | Hikosaka | ............... H01L 33/50 257/98 |
| 2012/0091883 A1* | 4/2012 | Nagai | .................... C09K 11/06 313/504 |
| 2014/0061683 A1* | 3/2014 | Chang | .................... H01L 33/52 257/88 |

(Continued)

*Primary Examiner* — Joseph L Williams
*Assistant Examiner* — Jose M Diaz
(74) *Attorney, Agent, or Firm* — Chun-Ming Shih; Lanway IPR Services

(57) ABSTRACT

A LED device includes LED chips mounted on a substrate, a first fluorescent layer, a second fluorescent layer and a package housing. The LED chips emit a blue light. The first fluorescent layer has a first side facing to the LED chips for converting the blue light to a red light. The second fluorescent layer has a first side attached to a second side of the first fluorescent layer for converting the blue light to a red light emitted from a second side of the second fluorescent layer. The package housing holds the substrate and the first fluorescent layer.

20 Claims, 18 Drawing Sheets

Related U.S. Application Data continuation-in-part of application No. 15/886,801, filed on Feb. 1, 2018, now Pat. No. 10,246,636.

(51) Int. Cl.
*H01L 33/60* (2010.01)
*H01L 33/48* (2010.01)
*H01L 33/62* (2010.01)

(52) U.S. Cl.
CPC ............ *H01L 33/505* (2013.01); *H01L 33/60* (2013.01); *H01L 33/62* (2013.01)

(58) Field of Classification Search
CPC ..... H01L 33/52; H01L 25/0753; C09K 11/02; C09K 11/06; C09K 11/08; C09K 11/0883; C08K 3/34
See application file for complete search history.

(56) References Cited

U.S. PATENT DOCUMENTS

| | | | |
|---|---|---|---|
| 2014/0246689 A1* | 9/2014 | Luo | H01L 33/504 257/98 |
| 2014/0319553 A1* | 10/2014 | Ye | H01L 33/0004 257/89 |
| 2015/0318451 A1* | 11/2015 | Ishida | C09K 11/7734 257/98 |
| 2016/0072026 A1* | 3/2016 | Kanaumi | H01L 33/507 257/98 |
| 2016/0108310 A1* | 4/2016 | Gu | C09K 11/06 136/247 |
| 2016/0322543 A1* | 11/2016 | Jeon | H01L 33/505 |
| 2017/0051157 A1* | 2/2017 | Chaloner-Gill | C08K 3/34 |
| 2018/0306420 A1* | 10/2018 | Ho | F21V 3/02 |
| 2019/0074327 A1* | 3/2019 | Yun | H01L 51/441 |
| 2019/0081122 A1* | 3/2019 | Kim | H01L 27/3267 |

* cited by examiner

LED DEVICE

RELATED APPLICATION

The present application is a continuation application of U.S. patent application Ser. No. 15/892,358.

FIELD OF THE INVENTION

The present invention is related to a LED (light emitted diode) device and more particularly related to a LED device using multiple types of phosphor materials.

BACKGROUND

After years of hard working, LED products have been widely spread over the world. At beginning, the cost of LED products is too high, preventing LED products to be popular. Nowadays, LED product price has lowered to an acceptable level.

However, it is always important to further find every aspect to improve such devices, particularly for such worldwide products related to human daily life. Heat efficiency, color rendering index, and more characteristics need to consider when designing LED devices.

In the present invention, inventors look deeper into the LED basic structure and finds several inventive points to further improve LED device performance.

SUMMARY OF INVENTION

According to a first embodiment of the present invention, a LED device includes a LED module, a first fluorescent layer, a second fluorescent layer and a package housing. The LED module includes a first group of LED chips and a second group of LED chips mounted on a substrate for emitting an original light of an original spectrum. For example, the LED chips are mounted on the substrate using Surface Mounting Device (SMD), Chip Scale Packaging (CSP), flip chip packaging, chip on board (COB) or other packaging methods.

The first fluorescent layer faces to the first group of LED chips for converting the original light to a first output light of a first spectrum. The second fluorescent layer faces to the second group of LED chips for converting the original light to a second output light of a second spectrum.

The package housing has a shape for holding the substrate, the first fluorescent layer and the second fluorescent layer. The first spectrum is partially overlapped with an excitation spectrum of the second fluorescent layer. In other words, when the first output light is emitted into the second fluorescent layer, the first output light may be further converted to a light of the second spectrum.

In one embodiment, the package housing has a first container and a second container for placing the first fluorescent layer and the second fluorescent layer respectively.

In another embodiment, the package housing has more than two containers for placing the first fluorescent layers and the second fluorescent layer arranged in interleaved manner. With such arrangement, the mixed light may be more smooth.

In some embodiments, there is a separating component for preventing the first output light to emit into the second fluorescent layer.

In some embodiments, furthermore, the separating component has a reflecting surface for reflecting and guiding the first output light to a predetermined direction. Therefore, for light emitted onto the reflecting surface, the light is redirected to a desired direction, e.g. top of the LED device or to other directions as predetermined light distribution.

In some embodiments, the package housing has multiple side walls for reflecting and directing the first output light and the second output light to predetermined directions.

In some embodiments, furthermore, the side walls have a convex or a concave structure engaging the first fluorescent layer or the second fluorescent layer. With such arrangement, the first fluorescent layer and the second fluorescent layer may have better reliability on fixing to the substrate.

Such convex structure or concave structure provides position limiting effect when materials the fluorescent layers are attached on or into such structures. Particularly, when the fluorescent layers are in gel mode when installed, such fluorescent layer flow and fit the surface of the concave or convex structures, forming a well holding structure.

In some embodiment, the first fluorescent layer has a first convex surface on top of the first fluorescent layer, the second fluorescent layer has a second convex surface on top of the second fluorescent layer.

In such design, the first convex surface and the second convex surface form lens guiding the first output light and the second output light for mixing the first output light and the second output light. Light paths may be well optimized for different light devices by adjusting the curve ratio, e.g. to form a condensed beam or a diversified light.

Except convex surface, in some other embodiments, the first fluorescent layer may have a first concave surface on top of the first fluorescent layer, and the second fluorescent layer has a second concave surface on top of the second fluorescent layer.

In some embodiments, the first output light, the second light and the original light not absorbed by the first fluorescent layer and the second fluorescent layer form an overall output spectrum of a white light.

Specifically, in some embodiments, the first fluorescent layer and the second fluorescent layer both comprise red phosphor material for generating 640-650 nm output light. In some other embodiments, the first fluorescent layer and the second fluorescent layer both comprise red phosphor material for generating 628-635 nm output light.

Please be noted that red, blue or green phosphor refer to phosphor material for emitting red, blue or green light, instead of defining the color of the phosphor materials themselves.

In some embodiments, the original spectrum is substantially corresponding to a blue light, the first spectrum is substantially corresponding to a green light, and the second spectrum is substantially corresponding to a red light.

In some other embodiments, the original spectrum is substantially corresponding to a ultraviolet light, the first fluorescent layer comprises green phosphor material and blue phosphor material for generating a green light and a blue light, the second fluorescent layer comprises red phosphor material for generating a red light.

In some other embodiments, the original spectrum is substantially corresponding to a ultraviolet light, the first fluorescent layer comprises green phosphor material and red phosphor material for generating a green light and a red light, the second fluorescent layer comprises blue phosphor material for generating a blue light.

In some embodiments, the first fluorescent layer and the second fluorescent layer have phosphor material, and the phosphor material has larger density near bottom than top in the first fluorescent layer and the second fluorescent layer. This increases better light efficacy because the bottom part of the first and the second fluorescent layers are closer to the light source, thus increasing phosphor excitation efficiency.

In some embodiments, the second fluorescent layer has a larger area than the first fluorescent layer.

In some embodiments, the second group of LED chips have more LED chips than the first group of LED chips.

According to another embodiment of the present invention, a LED (light emitted diode) device is provided. The LED device has a LED module, a first fluorescent layer, a second fluorescent layer, and a package housing.

The LED module is mounted on a substrate for emitting a blue light.

The first fluorescent layer has a first side facing to the LED module for converting the blue light to a red light.

The second fluorescent layer has a first side attached to a second side of the first fluorescent layer for converting the blue light to a red light emitted from a second side of the second fluorescent layer.

The package housing holds the substrate and the first fluorescent layer.

With such design, the first fluorescent layer is between the second fluorescent layer and the LED module. In other words, a blue light emitted from the LED module firstly enters the first fluorescent layer, hitting certain phosphor material and generating corresponding red light. In addition, some part of the blue light further moves to the second fluorescent layer to hit other phosphor material to generate green light. With red light and green light, users may see a white light effect.

In some embodiments, the LED module has multiple LED chips emitting the blue light. The substrate has a first terminal area and a second terminal area for mounting the multiple LED chips. For example, multiple LED chips are mounted on conductive plates used as the terminal areas with surface mounting device (SMD) technology.

The first terminal area and the second terminal area are provided for respectively connected to a positive terminal and a negative terminal of a power source. The first terminal area may have different size as the second terminal area. For example, when there are more LED chips mounted on the first terminal area than on the second terminal area, the first terminal area may have a larger size than the second terminal area to provide better heat dissipation effect.

In some embodiments, the first fluorescent has red phosphor material contained in first silicone part, and the second fluorescent layer has green phosphor material contained in a second silicone part. Please be noted that other materials in addition to silica gel, like resin, may be used for containing phosphor powder.

In addition, a part of the green light may excite the red phosphor if the green light hits the red phosphor. In other words, if the blue light firstly enters the second fluorescent layer, the blue light may firstly be converted to green light. If such green light continues to move into the first fluorescent layer, part or all of the green light may be consumed and converted into red light. This may decrease the overall green light energy and decreases an overall CRI (color rendering index) of the LED device.

Therefore, it is beneficial to place the first fluorescent layer between the second fluorescent layer and the LED module, for improving green light output and deceasing undesired consumption of the green light output.

Inventors also find that there the volume ratio of phosphor material in the first fluorescent layer and the second fluorescent layer may be adjusted to further improve different characteristics of the LED device.

In some cases, a first volume ratio of the red phosphor to the first silicone part is larger than a second volume ratio of the green phosphor to the second silicone part.

In some other cases, a first volume ratio of the red phosphor to the first silicone part is smaller than a second volume ratio of the green phosphor to the second silicone part.

These embodiments provide different features and characteristics, suitable for making various LED products.

In some embodiments, a thickness of the first fluorescent layer is larger than a thickness of the second fluorescent layer.

In some other embodiments, a thickness of the first fluorescent layer is smaller than a thickness of the second fluorescent layer.

Such variations are found helpful for adjusting product characteristic of the LED device.

In addition, the first fluorescent layer may have better heat resisting feature than the second fluorescent layer, when the first fluorescent layer is placed closer to the LED module. In other words, designers may place phosphor material with less heat resisting characteristic as the second fluorescent layer.

In some embodiments, the package housing may have a bottom part fixed to the substrate and the package housing has a surrounding wall extended from the bottom part. The wall defines a containing space for holding the first fluorescent layer.

For example, the package housing has a hole for holding the substrate and four connecting walls forming a rectangular containing space. The first fluorescent layer and sometimes the second fluorescent layer are placed in the containing space.

There are several ways to design the second fluorescent layer.

In some embodiments, a second side of the second fluorescent layer has a curved surface. In other words, the top surface of the second fluorescent layer may have a curve surface.

Specifically, an angle of edges of the first side and the second side of the second fluorescent layer would be less than 60 degrees. Such design may increase overall product stability.

In some embodiments, the curve surface forms a convex lens, providing better optical characteristic for output light, by directing light to desired direction.

According to another embodiment of the present invention, a LED device includes a LED module, a first fluorescent layer, and a second fluorescent layer.

The LED module includes a plurality of LED components mounted on a substrate for emitting an original light of an original spectrum.

The first fluorescent layer surrounds the plurality of LED components for converting the original light to a first output light of a first spectrum. The second fluorescent layer is stacked on the first fluorescent layer for converting the original light not absorbed by the first fluorescent layer and entering the second fluorescent layer to a second output light of a second spectrum. In addition, the second spectrum is partially overlapped with an excitation spectrum of the second fluorescent layer.

In some embodiment, the LED device further includes a package housing for holding the substrate and the first fluorescent layer. The substrate has a plurality of electrode pads. The plurality of LED components are attached to the plurality of electrode pads and electrically connected with wires. The electrode pads are connected to an external power source to drive the LED components to emit the original light.

In some embodiments, the LED components are LED semiconductor chips mounted on the substrate using chip-on-board packaging.

In some other embodiments, the LED component is made with CSP (Chip Scale Package). In addition, the LED device may include a package housing with reflecting walls for reflecting the original light, the first output light, the second output light to predetermined directions. On designing the angle of the reflecting walls, the second output light is prevented to enter the first fluorescent layer to cause energy waste and total output of the second output light.

In some other embodiments, the substrate is an elongated strip. Such elongated strip with LED modules may be used for manufacturing various bulbs emulating the shape of traditional bulbs. In addition, when the substrate is transparent, e.g. glass material, the LED device may further have a third fluorescent layer attaching to a backside of the elongated strip for converting the original light passing through the elongated strip to a third output light of the first spectrum, and a fourth fluorescent layer stacked on the third fluorescent layer for converting the original light not absorbed by the third fluorescent layer and entering the fourth fluorescent layer to a fourth output light of the second spectrum.

In some other embodiments, the substrate is a flexible circuit board substrate.

In some embodiments, the LED device may further have a side wall fixed to the substrate. The side wall has a convex structure or a concave structure engaging the second fluorescent layer. Such convex structure and concave structure may also be used for fixing the first fluorescent layer. This is particularly helpful when the first fluorescent layer and the second fluorescent layer are heated to gel mode during manufacturing. It is difficult to control the surface temperature of the fluorescent layers to be attached together. With such structures, the fluorescent layers are fixed more reliably.

In some embodiments, the first fluorescent layer has a first convex surface on top of the first fluorescent layer, the second fluorescent layer has a second convex surface on top of the second fluorescent layer. The first convex surface and the second convex surface may form one or more lens guiding the first output light and the second output light for mixing the first output light and the second output light.

In some other embodiments, the first fluorescent layer has a first concave surface on top of the first fluorescent layer, the second fluorescent layer has a second concave surface on top of the second fluorescent layer.

In some embodiments, there is a boundary surface between the first fluorescent layer and the second fluorescent layer, and the boundary surface is a convex surface facing to the LED module.

In some other embodiments, the boundary surface between the first fluorescent layer and the second fluorescent layer is a concave surface facing to the LED module.

In some embodiments, the first output light, the second light and the original light not absorbed by the first fluorescent layer and the second fluorescent layer form an overall output spectrum of a white light.

Furthermore, in some embodiments, the first fluorescent layer and the second fluorescent layer both include red phosphor material for generating 640-650 nm output light.

In some other embodiments, the first fluorescent layer and the second fluorescent layer both include red phosphor material for generating 628-635 nm output light.

In some embodiments, there is an intermediate part between the first fluorescent layer and the second fluorescent layer. The intermediate part includes mixed materials of the first fluorescent layer and the second fluorescent layer. The thickness of the intermediate part may be less than 10% of the total width of the first fluorescent layer and the second fluorescent layer. The intermediate part has a plurality of micro convex structures between the first fluorescent layer and the second fluorescent layer. Such convex structures may form a plurality of micro optical lens for better distribute light paths.

In another embodiment according to the present invention, a LED device includes a LED module, a first fluorescent layer and a second fluorescent layer.

The LED module includes a plurality of LED components mounted on a substrate for emitting an original light of an original spectrum. The first fluorescent layer surrounds the plurality of LED components for converting the original light to a first output light of a first spectrum. The second fluorescent layer is stacked on the first fluorescent layer for converting the original light not absorbed by the first fluorescent layer and entering the second fluorescent layer to generate a second output light of a second spectrum.

The second spectrum is partially overlapped with an excitation spectrum of the first fluorescent layer. In addition, there is an intermediate part between the first fluorescent layer and the second fluorescent layer. The intermediate part includes mixed materials of the first fluorescent layer and the second fluorescent layer. The intermediate part has a plurality of micro convex structures between the first fluorescent layer and the second fluorescent layer.

In some embodiments, the first fluorescent layer is a dome shape and the second fluorescent layer and the substrate surround the first fluorescent layer.

In some embodiments, the LED device further includes a package housing, wherein the package housing and the substrate form a container for storing the first fluorescent layer.

In some embodiments, the package housing has a surrounding side wall with larger peripheral size at top than at bottom, e.g. like an inverted pyramid. Such structure further prevents unnecessary waste of the second output light to be emitted into the first fluorescent layer.

In some embodiments, the package housing has a surrounding side wall with a reflecting surface facing to the first fluorescent layer.

In some embodiments, a heat dissipation material, like powder mixed with metal oxide or metal crystals, may bed mixed in the first fluorescent layer.

In some embodiments, the original spectrum is substantially corresponding to a ultraviolet light. The second fluorescent layer contains green phosphor material and blue phosphor material for generating a green light and a blue light, the first fluorescent layer contains red phosphor material for generating a red light.

In some embodiments, the LED device may further include a third fluorescent layer containing blue phosphor material for generating blue light spectrum. The second fluorescent layer may contain green phosphor material for generating a green light, and the first fluorescent layer may contain red phosphor material for generating a red light.

In some embodiments, the first fluorescent layer may contain red phosphor material and green phosphor material for generating a red light and a green light and the second fluorescent layer may contain blue phosphor material for generating a blue light.

In some other embodiments, area of the second side of the second fluorescent layer is smaller than area of the second side of the first fluorescent layer. In other words, when being looked over a top view, a part of the second side of the first fluorescent layer is exposed and uncovered by the second fluorescent layer.

In such case, there is an embodiment to place the second fluorescent in the middle place, which causes the second side of second fluorescent layer being surrounded by the second side of the first fluorescent layer from a top view.

In some embodiments, the package housing has a ladder wall for engaging with a peripheral part of the second fluorescent layer. In some manufacturing procedures, the first fluorescent layer and the second fluorescent layer are heated as gel mode to be filled into the package holding. When the package holding has a ladder wall, the first fluorescent layer may be filled in a first ladder while the second fluorescent layer may be filled to in a second ladder upper than the first ladder in the ladder wall.

In some embodiments, the second side of the second fluorescent layer forms a flat surface.

In some other embodiments, the second side of second fluorescent layer forms a curve surface for different optical characteristic requirement.

In some embodiments, the second side of the second fluorescent layer may have multiple convex part corresponding to multiple underlying LED chips of the LED module. It may be implemented by applying gel mode material of the second fluorescent layer to the package for several times respectively to underlying LED chips. Because LED chips usually have certain light emitting angle, it is helpful to maximize the light converting effect by placing more material of the second fluorescent layer on top of corresponding LED chips, particularly when phosphor material is critical cost in LED devices.

DETAILED DESCRIPTION

Figure 1:
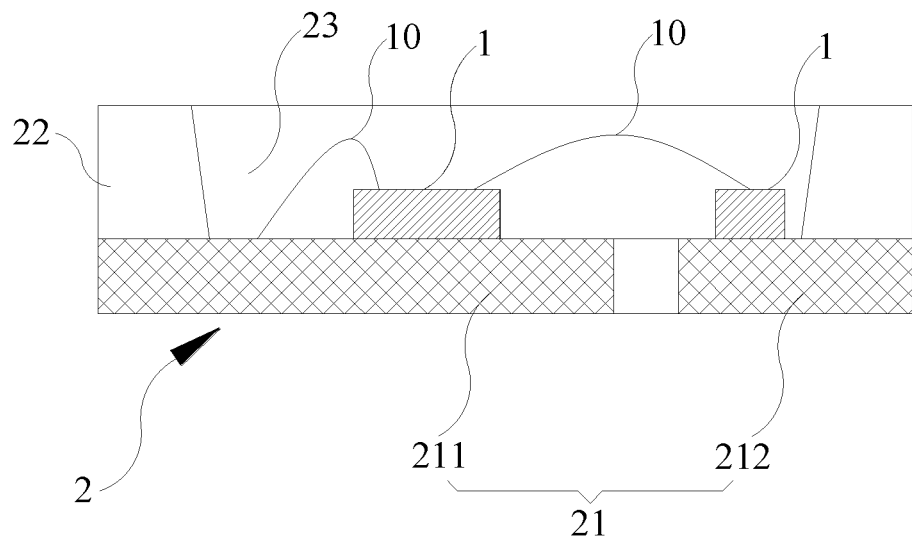
FIG. 1 is a diagram illustrating a LED device embodiment.
Figure 2:
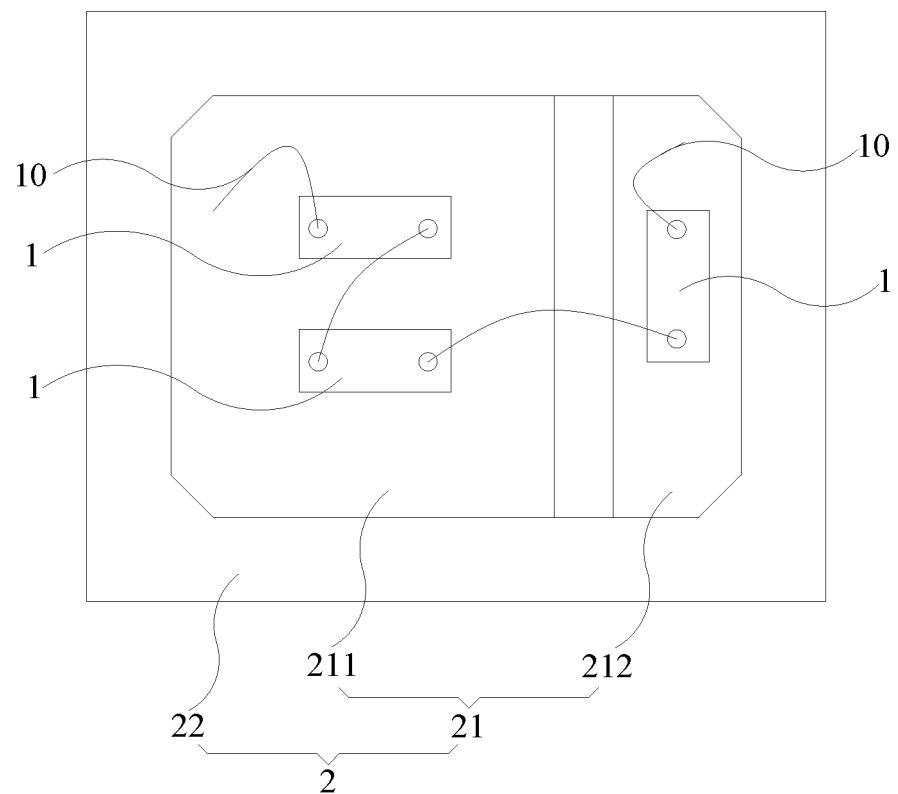
FIG. 2 is a top view of FIG. 1.
Figure 3:
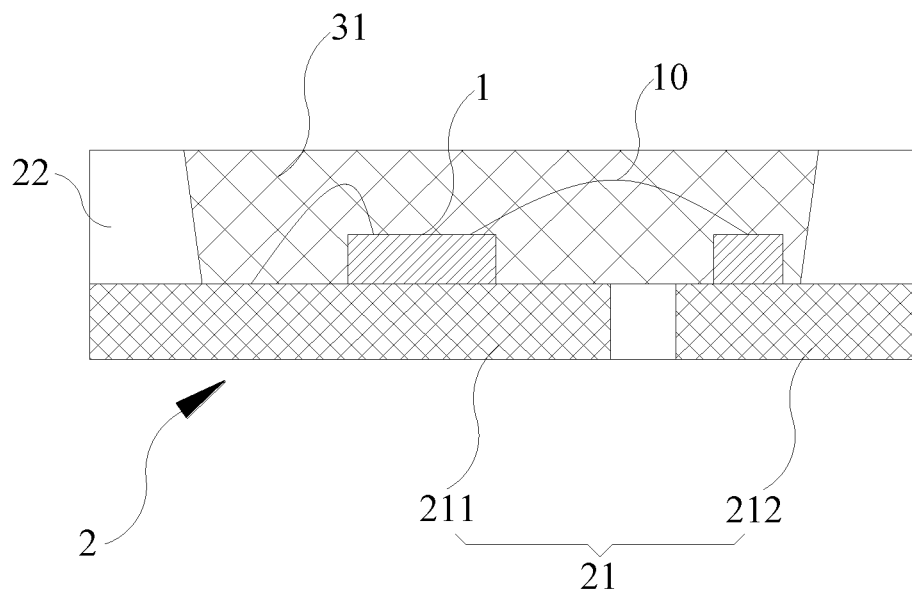
FIG. 3. Illustrates a first fluorescent layer installed in a LED device embodiment.
Figure 4:
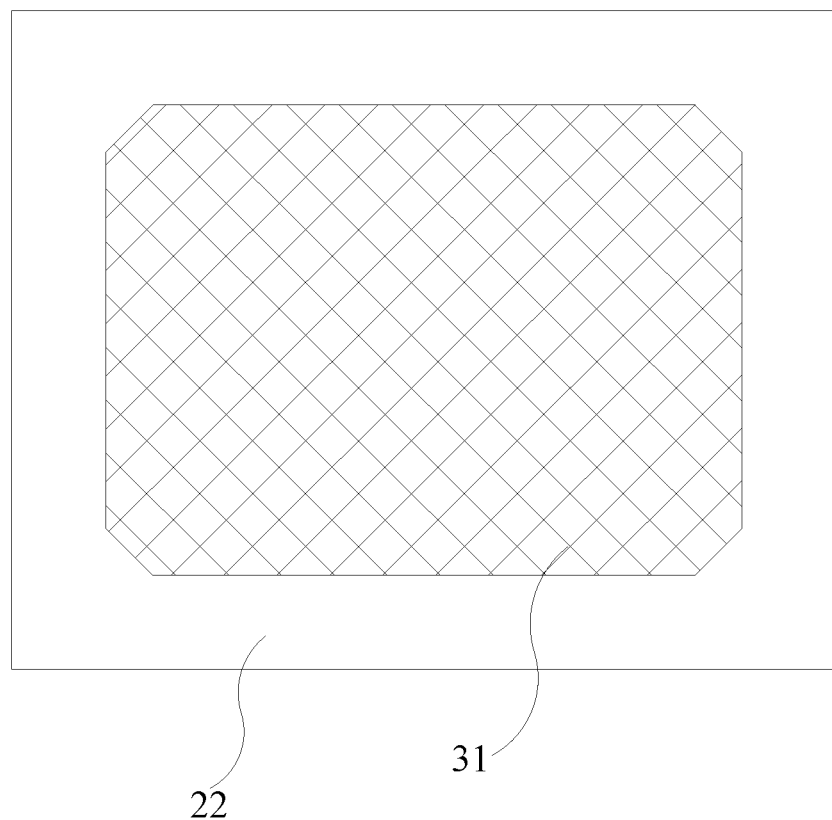
FIG. 4 illustrates a top view of FIG. 3.

According to an embodiment of the present invention, a LED device includes a LED module, a first fluorescent layer, a second fluorescent layer and a package housing. The LED module includes a first group of LED chips and a second group of LED chips mounted on a substrate for emitting an original light of an original spectrum. For example, the LED chips are mounted on the substrate using Surface Mounting Device (SMD), Chip Scale Packaging (CSP), flip chip packaging, chip on board (COB) or other packaging methods.

The first fluorescent layer faces to the first group of LED chips for converting the original light to a first output light of a first spectrum. The second fluorescent layer faces to the second group of LED chips for converting the original light to a second output light of a second spectrum.

The package housing has a shape for holding the substrate, the first fluorescent layer and the second fluorescent layer. The first spectrum is partially overlapped with an excitation spectrum of the second fluorescent layer. In other words, when the first output light is emitted into the second fluorescent layer, the first output light may be further converted to a light of the second spectrum.

In one embodiment, the package housing has a first container and a second container for placing the first fluorescent layer and the second fluorescent layer respectively.

In another embodiment, the package housing has more than two containers for placing the first fluorescent layers and the second fluorescent layer arranged in interleaved manner. With such arrangement, the mixed light may be more smooth.

In some embodiments, there is a separating component for preventing the first output light to emit into the second fluorescent layer.

In some embodiments, furthermore, the separating component has a reflecting surface for reflecting and guiding the first output light to a predetermined direction. Therefore, for light emitted onto the reflecting surface, the light is redirected to a desired direction, e.g. top of the LED device or to other directions as predetermined light distribution.

In some embodiments, the package housing has multiple side walls for reflecting and directing the first output light and the second output light to predetermined directions.

In some embodiments, furthermore, the side walls has a convex or a concave structure engaging the first fluorescent layer or the second fluorescent layer. With such arrangement, the first fluorescent layer and the second fluorescent layer may have better reliability on fixing to the substrate.

Such convex structure or concave structure provides position limiting effect when materials the fluorescent layers are attached on or into such structures. Particularly, when the fluorescent layers are in gel mode when installed, such fluorescent layer flow and fit the surface of the concave or convex structures, forming a well holding structure.

In some embodiment, the first fluorescent layer has a first convex surface on top of the first fluorescent layer, the second fluorescent layer has a second convex surface on top of the second fluorescent layer.

In such design, the first convex surface and the second convex surface form lens guiding the first output light and the second output light for mixing the first output light and the second output light. Light paths may be well optimized for different light devices by adjusting the curve ratio, e.g. to form a condensed beam or a diversified light.

Except convex surface, in some other embodiments, the first fluorescent layer may have a first concave surface on top of the first fluorescent layer, and the second fluorescent layer has a second concave surface on top of the second fluorescent layer.

In some embodiments, the first output light, the second light and the original light not absorbed by the first fluorescent layer and the second fluorescent layer form an overall output spectrum of a white light.

Specifically, in some embodiments, the first fluorescent layer and the second fluorescent layer both comprise red phosphor material for generating 640-650 nm output light. In some other embodiments, the first fluorescent layer and the second fluorescent layer both comprise red phosphor material for generating 628-635 nm output light.

Please be noted that red, blue or green phosphor refer to phosphor material for emitting red, blue or green light, instead of defining the color of the phosphor materials themselves.

In some embodiments, the original spectrum is substantially corresponding to a blue light, the first spectrum is substantially corresponding to a green light, and the second spectrum is substantially corresponding to a red light.

In some other embodiments, the original spectrum is substantially corresponding to a ultraviolet light, the first fluorescent layer comprises green phosphor material and blue phosphor material for generating a green light and a blue light, the second fluorescent layer comprises red phosphor material for generating a red light.

In some other embodiments, the original spectrum is substantially corresponding to a ultraviolet light, the first fluorescent layer comprises green phosphor material and red phosphor material for generating a green light and a red light, the second fluorescent layer comprises blue phosphor material for generating a blue light.

In some embodiments, the first fluorescent layer and the second fluorescent layer have phosphor material, and the phosphor material has larger density near bottom than top in the first fluorescent layer and the second fluorescent layer. This increases better light efficacy because the bottom part of the first and the second fluorescent layers are closer to the light source, thus increasing phosphor excitation efficiency.

In some embodiments, the second fluorescent layer has a larger area than the first fluorescent layer.

In some embodiments, the second group of LED chips have more LED chips than the first group of LED chips.

According to another embodiment of the present invention, a LED device includes a LED module, a first fluorescent layer, and a second fluorescent layer.

The LED module includes a plurality of LED components mounted on a substrate for emitting an original light of an original spectrum.

The first fluorescent layer surrounds the plurality of LED components for converting the original light to a first output light of a first spectrum. The second fluorescent layer is stacked on the first fluorescent layer for converting the original light not absorbed by the first fluorescent layer and entering the second fluorescent layer to a second output light of a second spectrum. In addition, the second spectrum is partially overlapped with an excitation spectrum of the second fluorescent layer.

In some embodiment, the LED device further includes a package housing for holding the substrate and the first fluorescent layer. The substrate has a plurality of electrode pads. The plurality of LED components are attached to the plurality of electrode pads and electrically connected with wires. The electrode pads are connected to an external power source to drive the LED components to emit the original light.

In some embodiments, the LED components are LED semiconductor chips mounted on the substrate using chip-on-board packaging.

In some other embodiments, the LED component is made with CSP (Chip Scale Package). In addition, the LED device may include a package housing with reflecting walls for reflecting the original light, the first output light, the second output light to predetermined directions. On designing the angle of the reflecting walls, the second output light is prevented to enter the first fluorescent layer to cause energy waste and total output of the second output light.

In some other embodiments, the substrate is an elongated strip. Such elongated strip with LED modules may be used for manufacturing various bulbs emulating the shape of traditional bulbs. In addition, when the substrate is transparent, e.g. glass material, the LED device may further have a third fluorescent layer attaching to a backside of the elongated strip for converting the original light passing through the elongated strip to a third output light of the first spectrum, and a fourth fluorescent layer stacked on the third fluorescent layer for converting the original light not absorbed by the third fluorescent layer and entering the fourth fluorescent layer to a fourth output light of the second spectrum.

In some other embodiments, the substrate is a flexible circuit board substrate.

In some embodiments, the LED device may further have a side wall fixed to the substrate. The side wall has a convex structure or a concave structure engaging the second fluorescent layer. Such convex structure and concave structure may also be used for fixing the first fluorescent layer. This is particularly helpful when the first fluorescent layer and the second fluorescent layer are heated to gel mode during manufacturing. It is difficult to control the surface temperature of the fluorescent layers to be attached together. With such structures, the fluorescent layers are fixed more reliably.

In some embodiments, the first fluorescent layer has a first convex surface on top of the first fluorescent layer, the second fluorescent layer has a second convex surface on top of the second fluorescent layer. The first convex surface and the second convex surface may forming one or more lens guiding the first output light and the second output light for mixing the first output light and the second output light.

In some other embodiments, the first fluorescent layer has a first concave surface on top of the first fluorescent layer, the second fluorescent layer has a second concave surface on top of the second fluorescent layer.

In some embodiments, there is a boundary surface between the first fluorescent layer and the second fluorescent layer, and the boundary surface is a convex surface facing to the LED module.

In some other embodiments, the boundary surface between the first fluorescent layer and the second fluorescent layer is a concave surface facing to the LED module.

In some embodiments, the first output light, the second light and the original light not absorbed by the first fluorescent layer and the second fluorescent layer form an overall output spectrum of a white light.

Furthermore, in some embodiments, the first fluorescent layer and the second fluorescent layer both include red phosphor material for generating 640-650 nm output light.

In some other embodiments, the first fluorescent layer and the second fluorescent layer both include red phosphor material for generating 628-635 nm output light.

In some embodiments, there is an intermediate part between the first fluorescent layer and the second fluorescent layer. The intermediate part includes mixed materials of the first fluorescent layer and the second fluorescent layer. The thickness of the intermediate part may be less than 10% of the total width of the first fluorescent layer and the second fluorescent layer. The intermediate part has a plurality of micro convex structures between the first fluorescent layer and the second fluorescent layer. Such convex structures may form a plurality of micro optical lens for better distribute light paths.

The LED module includes a plurality of LED components mounted on a substrate for emitting an original light of an original spectrum. The first fluorescent layer surrounds the plurality of LED components for converting the original light to a first output light of a first spectrum. The second fluorescent layer is stacked on the first fluorescent layer for converting the original light not absorbed by the first fluorescent layer and entering the second fluorescent layer to generate a second output light of a second spectrum.

The second spectrum is partially overlapped with an excitation spectrum of the first fluorescent layer. In addition, there is an intermediate part between the first fluorescent layer and the second fluorescent layer. The intermediate part includes mixed materials of the first fluorescent layer and the second fluorescent layer. The intermediate part has a plurality of micro convex structures between the first fluorescent layer and the second fluorescent layer.

In some embodiments, the first fluorescent layer is a dome shape and the second fluorescent layer and the substrate surround the first fluorescent layer.

In some embodiments, the LED device further includes a package housing, wherein the package housing and the substrate form a container for storing the first fluorescent layer.

In some embodiments, the package housing has a surrounding side wall with larger peripheral size at top than at bottom, e.g. like an inverted pyramid. Such structure further prevents unnecessary waste of the second output light to be emitted into the first fluorescent layer.

In some embodiments, the package housing has a surrounding side wall with a reflecting surface facing to the first fluorescent layer.

In some embodiments, a heat dissipation material, like powder mixed with metal oxide or metal crystals, may bed mixed in the first fluorescent layer.

In some embodiments, the original spectrum is substantially corresponding to a ultraviolet light. The second fluorescent layer contains green phosphor material and blue phosphor material for generating a green light and a blue light, the first fluorescent layer contains red phosphor material for generating a red light.

In some embodiments, the LED device may further include a third fluorescent layer containing blue phosphor material for generating blue light spectrum. The second fluorescent layer may contain green phosphor material for generating a green light, and the first fluorescent layer may contain red phosphor material for generating a red light.

In some embodiments, the first fluorescent layer may contain red phosphor material and green phosphor material for generating a red light and a green light and the second fluorescent layer may contain blue phosphor material for generating a blue light.

According to another embodiment of the present invention, a LED (light emitted diode) device is provided. The LED device has a LED module, a first fluorescent layer, a second fluorescent layer, and a package housing.

The LED module is mounted on a substrate for emitting a blue light.

The first fluorescent layer has a first side facing to the LED module for converting the blue light to a red light.

The second fluorescent layer has a first side attached to a second side of the first fluorescent layer for converting the blue light to a red light emitted from a second side of the second fluorescent layer.

The package housing holds the substrate and the first fluorescent layer.

With such design, the first fluorescent layer is between the second fluorescent layer and the LED module. In other words, a blue light emitted from the LED module firstly enters the first fluorescent layer, hitting certain phosphor material and generating corresponding red light. In addition, some part of the blue light further moves to the second fluorescent layer to hit other phosphor material to generate green light. With red light and green light, users may see a white light effect.

In some embodiments, the LED module has multiple LED chips emitting the blue light. The substrate has a first terminal area and a second terminal area for mounting the multiple LED chips. For example, multiple LED chips are mounted on conductive plates used as the terminal areas with surface mounting device (SMD) technology.

The first terminal area and the second terminal area are provided for respectively connected to a positive terminal and a negative terminal of a power source. The first terminal area may have different size as the second terminal area. For example, when there are more LED chips mounted on the first terminal area than on the second terminal area, the first terminal area may have a larger size than the second terminal area to provide better heat dissipation effect.

In some embodiments, the first fluorescent has red phosphor material contained in first silicone part, and the second fluorescent layer has green phosphor material contained in a second silicone part. Please be noted that other materials in addition to silica gel, like resin, may be used for containing phosphor powder.

In addition, a part of the green light may excite the red phosphor if the green light hits the red phosphor. In other words, if the blue light firstly enters the second fluorescent layer, the blue light may firstly be converted to green light. If such green light continues to move into the first fluorescent layer, part or all of the green light may be consumed and converted into red light. This may decrease the overall green light energy and decreases an overall CRI (color rendering index) of the LED device.

Therefore, it is beneficial to place the first fluorescent layer between the second fluorescent layer and the LED module, for improving green light output and deceasing undesired consumption of the green light output.

Inventors also find that there the volume ratio of phosphor material in the first fluorescent layer and the second fluorescent layer may be adjusted to further improve different characteristics of the LED device.

In some cases, a first volume ratio of the red phosphor to the first silicone part is larger than a second volume ratio of the green phosphor to the second silicone part.

In some other cases, a first volume ratio of the red phosphor to the first silicone part is smaller than a second volume ratio of the green phosphor to the second silicone part.

The provide different features and characteristics, suitable for making various LED products.

In some embodiments, a thickness of the first fluorescent layer is larger than a thickness of the second fluorescent layer.

In some other embodiments, a thickness of the first fluorescent layer is smaller than a thickness of the second fluorescent layer.

Such variations are found helpful for adjusting product characteristic of the LED device.

In addition, the first fluorescent layer may have better heat resisting feature than the second fluorescent layer, when the first fluorescent layer is placed closer to the LED module. In other words, designers may place phosphor material with less heat resisting characteristic as the second fluorescent layer.

In some embodiments, the package housing may have a bottom part fixed to the substrate and the package housing has a surrounding wall extended from the bottom part. The wall defines a containing space for holding the first fluorescent layer.

For example, the package housing has a hole for holding the substrate and four connecting walls forming a rectangular containing space. The first fluorescent layer and sometimes the second fluorescent layer are placed in the containing space.

There are several ways to design the second fluorescent layer.

In some embodiments, a second side of the second fluorescent layer has a curved surface. In other words, the top surface of the second fluorescent layer may have a curve surface.

Specifically, an angle of edges of the first side and the second side of the second fluorescent layer would be less than 60 degrees. Such design may increase overall product stability.

In some embodiments, the curve surface forms a convex lens, providing better optical characteristic for output light, by directing light to desired direction.

In some other embodiments, area of the second side of the second fluorescent layer is smaller than area of the second side of the first fluorescent layer. In other words, when being looked over a top view, a part of the second side of the first fluorescent layer is exposed and uncovered by the second fluorescent layer.

In such case, there is an embodiment to place the second fluorescent in the middle place, which causes the second side of second fluorescent layer being surrounded by the second side of the first fluorescent layer from a top view.

In some embodiments, the package housing has a ladder wall for engaging with a peripheral part of the second fluorescent layer. In some manufacturing procedures, the first fluorescent layer and the second fluorescent layer are heated as gel mode to be filled into the package holding. When the package holding has a ladder wall, the first fluorescent layer may be filled in a first ladder while the second fluorescent layer may be filled to in a second ladder upper than the first ladder in the ladder wall.

In some embodiments, the second side of the second fluorescent layer forms a flat surface.

In some other embodiments, the second side of second fluorescent layer forms a curve surface for different optical characteristic requirement.

In some embodiments, the second side of the second fluorescent layer may have multiple convex part corresponding to multiple underlying LED chips of the LED module. It may be implemented by applying gel mode material of the second fluorescent layer to the package for several times respectively to underlying LED chips. Because LED chips usually have certain light emitting angle, it is helpful to maximize the light converting effect by placing more material of the second fluorescent layer on top of corresponding LED chips, particularly when phosphor material is critical cost in LED devices.

Please refer to FIG. 1 to FIG. 6, illustrating a LED device embodiment.

The LED device has LED chips 1 and a bracket 2 for fixing the LED chips 1. The LED bracket 2 contains a substrate 21 and four side walls 22 as a package housing. The substrate 21 and the side walls 22 form a containing space 23.

A first terminal area 211 and a second terminal area 212 are disposed on the substrate. The LED chips 1 are placed in the containing space 23 and mounted on surface of the first terminal area 211 and the second terminal area 212, e.g. via surface mounting device (SMD) technology. The LED chips 1 may be electrically connected in series or in other combination. The first terminal area 211 and the second terminal 212 are further electrically connected to a power source to supply electricity to the LED chips 1.

A first fluorescent layer 31 is disposed for covering the LED chips 1. A second fluorescent layer 32 is on top of the first fluorescent layer 31. The wave length of emitted light of the first fluorescent layer 31 is longer than the wave length of emitted light of the second fluorescent layer 32 when a blue light or an ultraviolet light is respectively emitted into the first fluorescent layer 31 and the second fluorescent layer 32. For example, the first fluorescent layer emits red light when blue light enters the first fluorescent layer 31, and the second fluorescent layer emits green light when blue light enters the second fluorescent layer 32.

In addition, the first fluorescent layer 31 may be made by mixing red phosphor in a silicone material, and the second fluorescent layer 32 may be made by mixing green phosphor in a silicone material.

The LED chips 1 may be LED chips emitting blue light of wavelengths within range 380 nm to 470 nm. The green light emitted from the second fluorescent layer 31 may be within range 500 nm to 560 nm. The red light emitted from the first fluorescent layer 32 may be within 600 nm to 670 nm.

Some blue light is not absorbed by either the first fluorescent layer 31 or the second fluorescent layer 32. Therefore, in some embodiment, the overall output light includes blue light, red light and green light, which together form a white light.

With such design, green light is not consumed by red phosphor material and further improves CRI (color rendering index) and overall luminous efficacy.

Please be noted that the embodiment is only for explaining the inventive concept, instead of limiting the inventive scope. Other variations may be made by persons of ordinary skilled in the art based on disclosure of this specification.

The bracket 2 may be SMD bracket made of PCT material, a mixture of CHDM (1,4-Cyclohexanedimethanol) and DMT (Terephthalic acid dimethyl ester).

Figure 5:
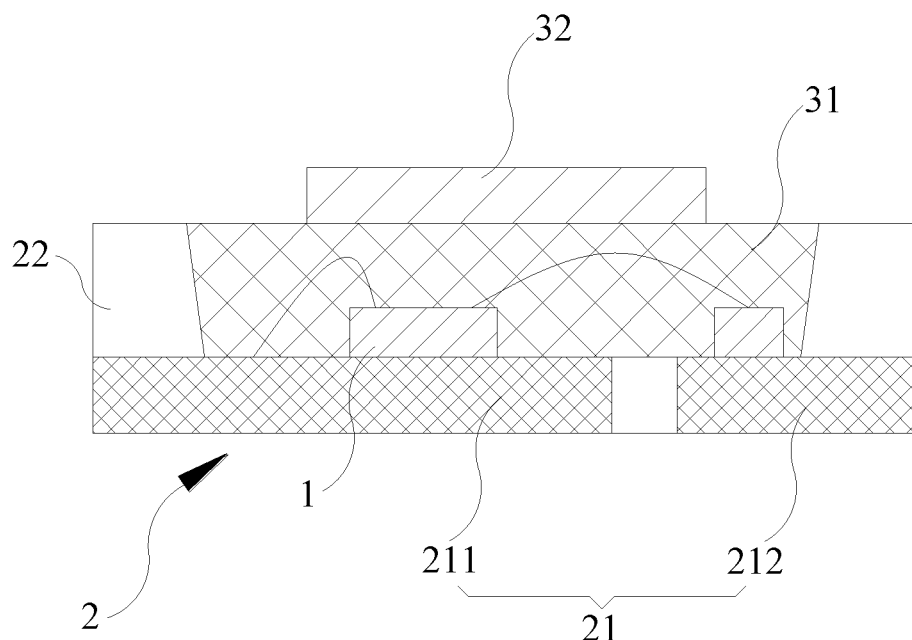
FIG. 5 illustrates a first way to add a second fluorescent layer.
Figure 6:
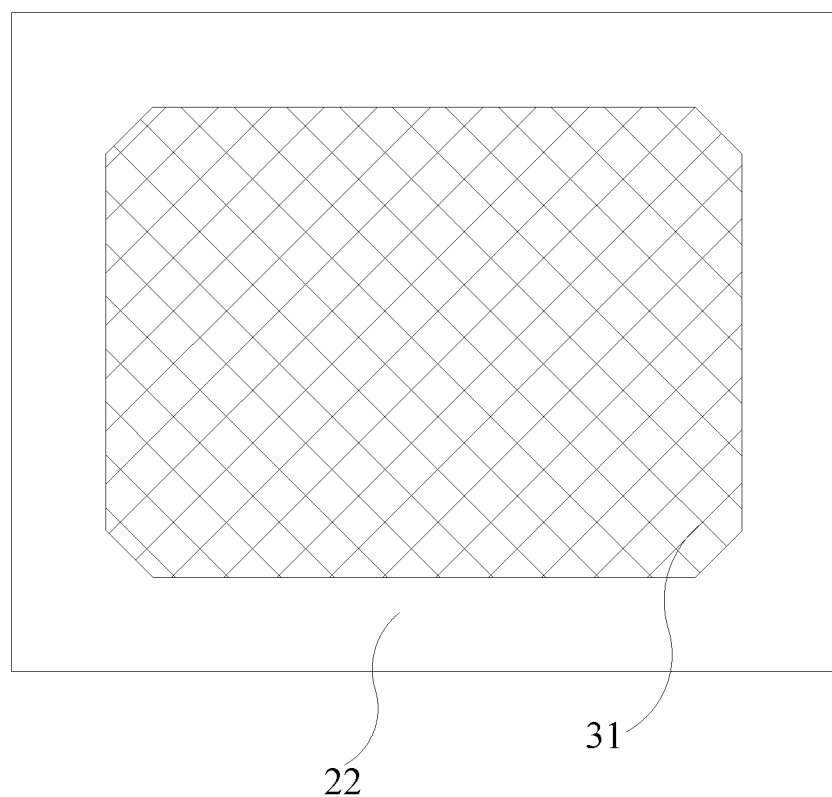
FIG. 6 illustrates a top view of FIG. 5.

Please refer to FIG. 5 and FIG. 6. In one embodiment, the first fluorescent layer 31 is disposed in the containing space 23. The top surface of the second side of the first fluorescent layer 31 is aligned with the top surface of the side walls 22.

The first side of the second fluorescent layer 32 is placed on top of the first fluorescent layer 31. The size of the second side of the second fluorescent layer 32 is smaller than the size of the second side of the first fluorescent layer 31. Therefore, part of the first fluorescent layer 31 is exposed and uncovered by the second fluorescent layer 32.

Figure 7:
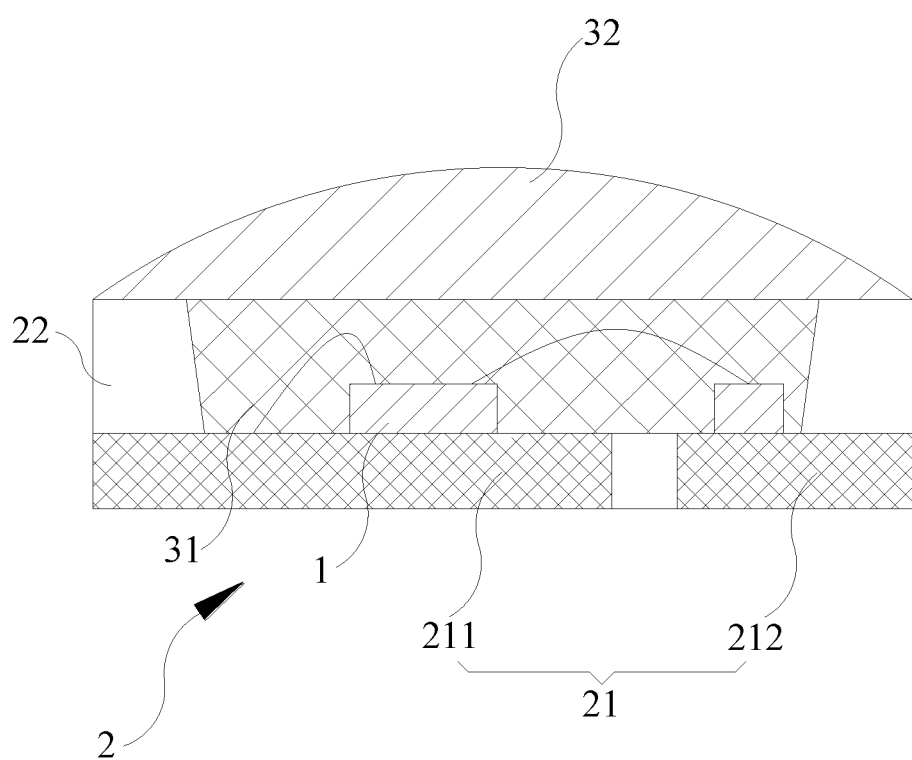
FIG. 7 illustrates another way to add a second fluorescent layer.
Figure 8:
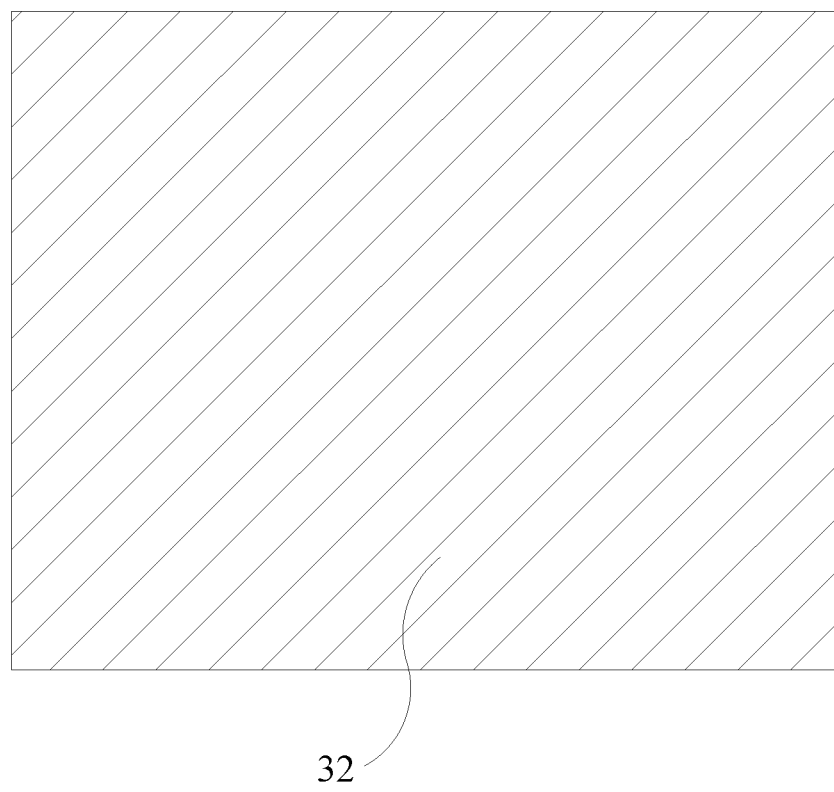
FIG. 8 illustrates a top view of FIG. 7.
Figure 9:
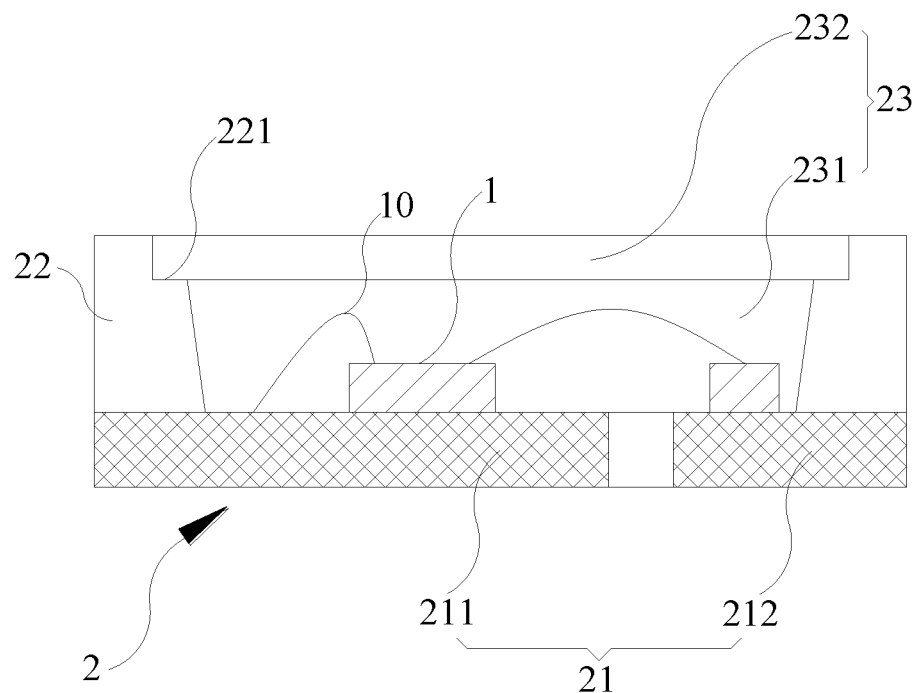
FIG. 9 illustrates another way to add a second fluorescent layer.
Figure 10:
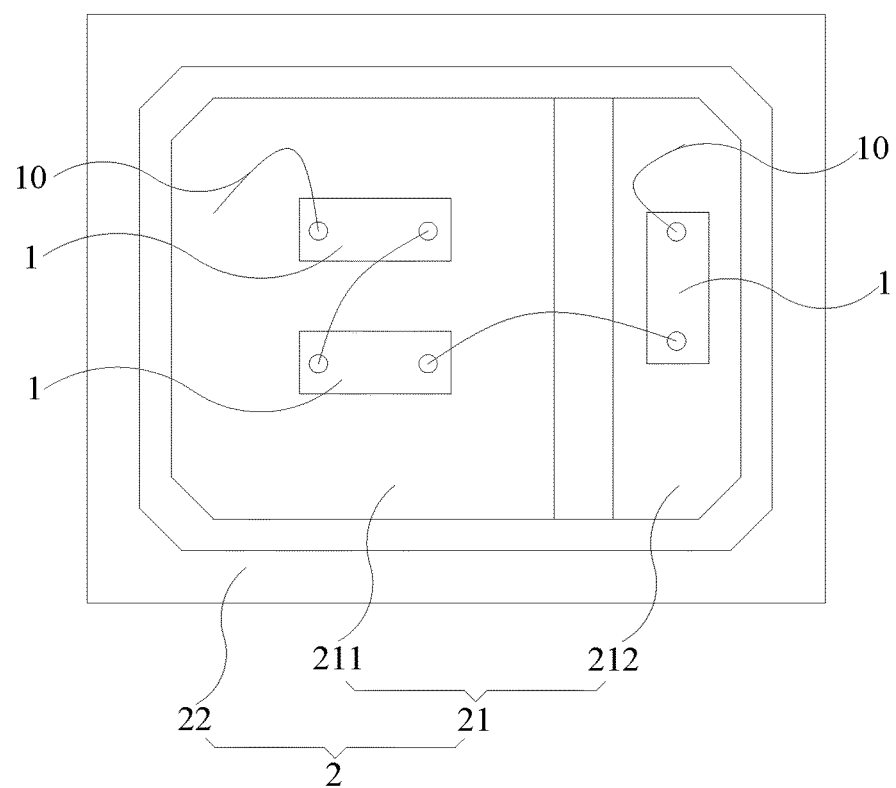
FIG. 10 illustrates LED chips in an embodiment.
Figure 11:
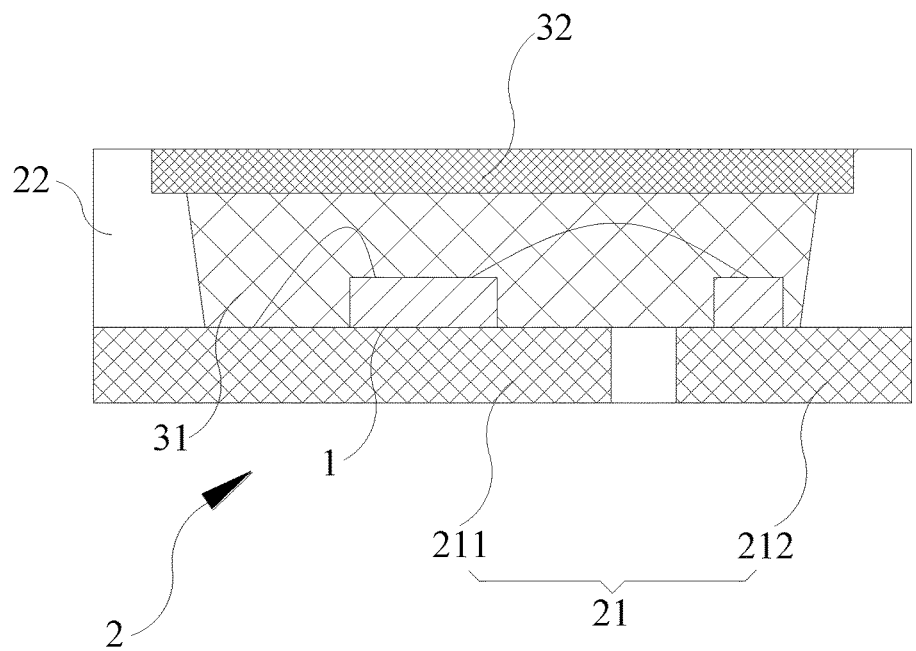
FIG. 11 illustrates another side view of a LED device embodiment.
Figure 12:
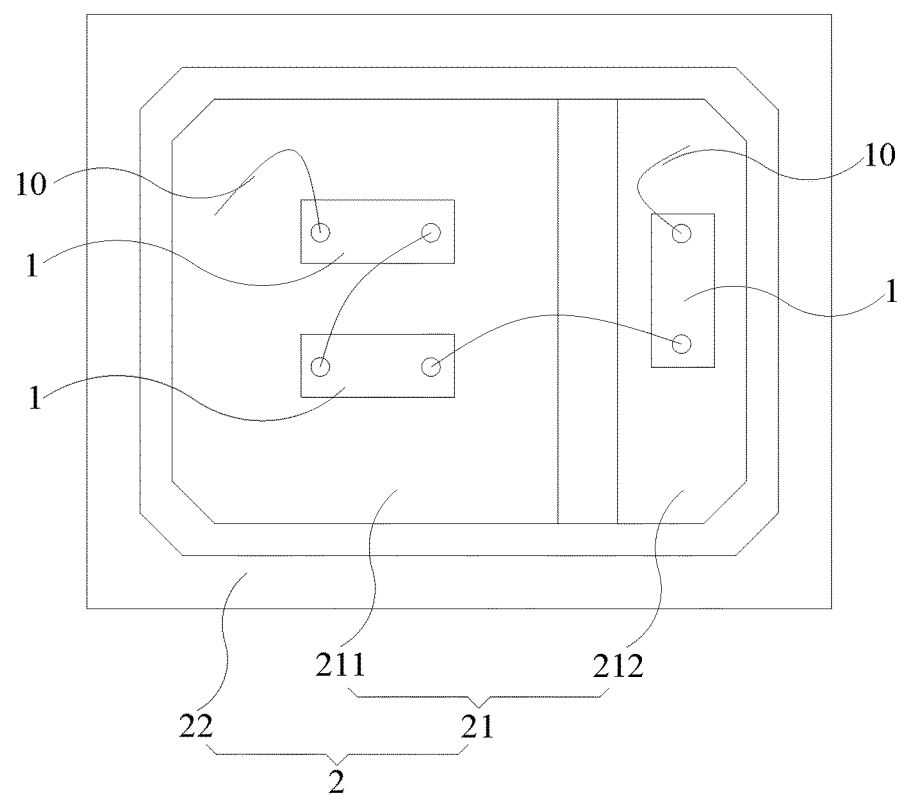
FIG. 12 illustrates a top view of a LED device embodiment.

Please refer to FIG. 7 and FIG. 8, which illustrate another way to add the second fluorescent layer.

In this embodiment, the first fluorescent layer 31 is placed in the containing space 23. The top surface of the first fluorescent layer 31 is aligned with the top surface of the side walls 22. The second fluorescent layer 32 is placed upon the first fluorescent layer 31.

In this embodiment, the second side of the second fluorescent layer 32 has a curve surface. The angle between the first side and the second side of the second fluorescent layer 32 is smaller than 60 degrees.

Please refer to FIG. 9 to FIG. 12.

In this embodiment, the side walls 22 have a ladder structure 221 for dividing the containing space 23 to a first containing space 231 and a second containing space 232.

The area of the second containing space 232 is larger than the area of the first containing space 231. The first fluorescent layer 31 is placed in the first containing space 231 and the second fluorescent layer 32 is placed in the second containing space 232.

Figure 13:
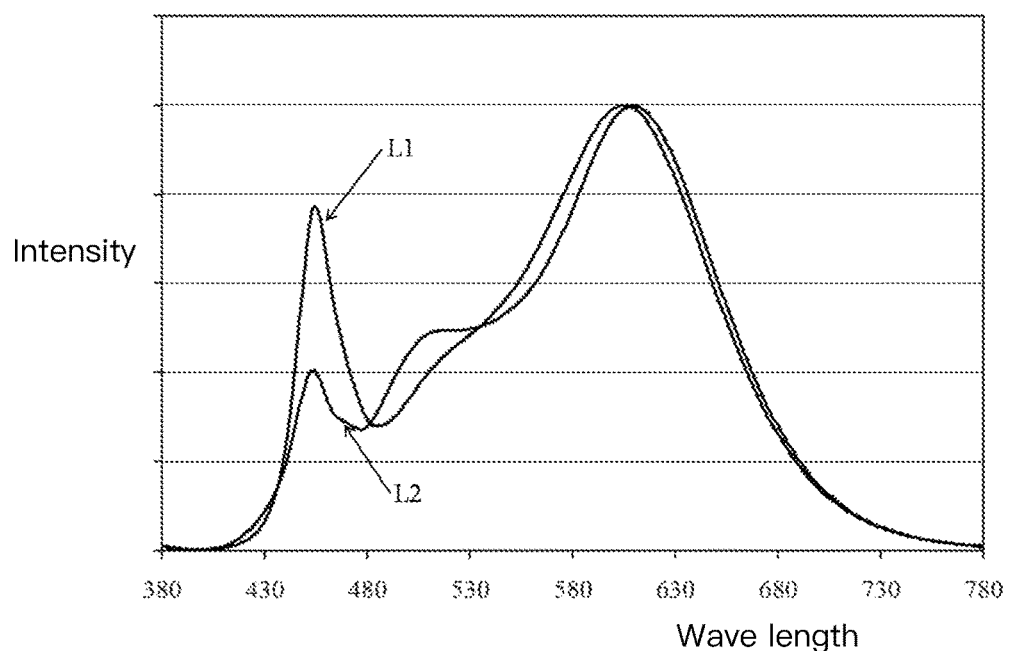
FIG. 13 illustrates a optical characteristic diagram of an experimental result.
Figure 14:
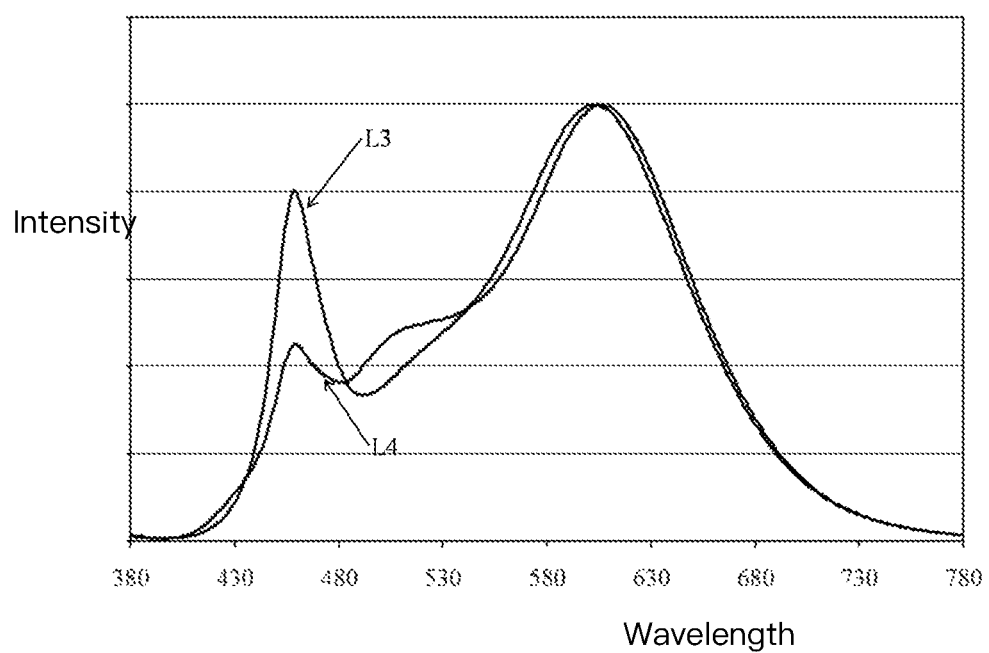
FIG. 14 illustrates another optical characteristic diagram of an experimental result.

Please refer to FIG. 13 and FIG. 14, which illustrate experimental results of such design.

FIG. 13 illustrate a conventional LED optical characteristic, while FIG. 14 illustrates optical characteristic of an example of the invention. It is clearly seen that the green light is well improved, which may increase overall CRI and luminous efficacy. Meanwhile, blue light is decreased to protect human eyes.

Figure 15A:
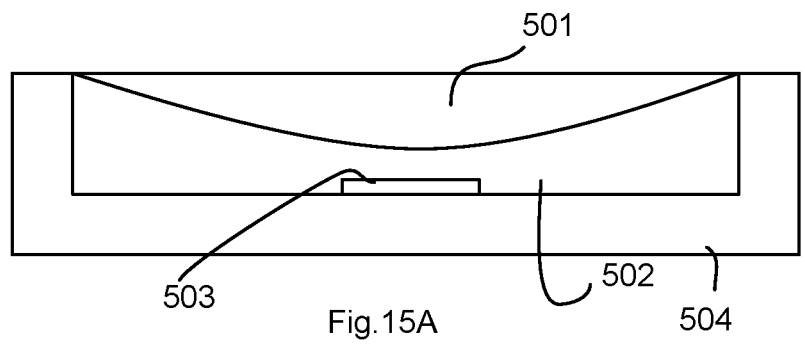
FIG. 15A is a diagram illustrating fluorescent layer shapes of an embodiment.
Figure 15B:
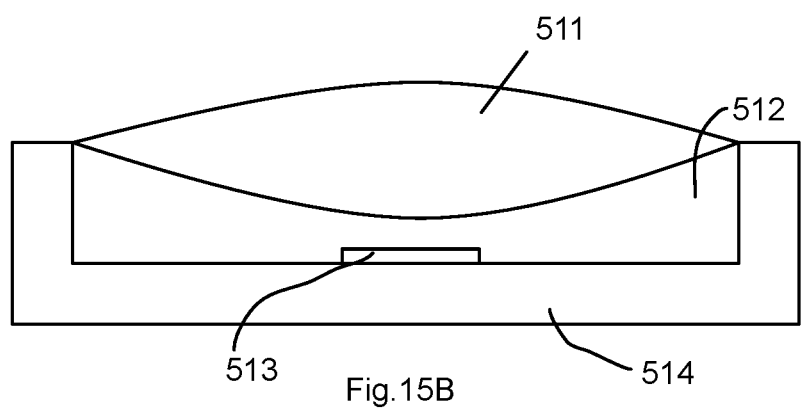
FIG. 15B is a diagram illustrating fluorescent layer shapes of another embodiment.
Figure 15C:
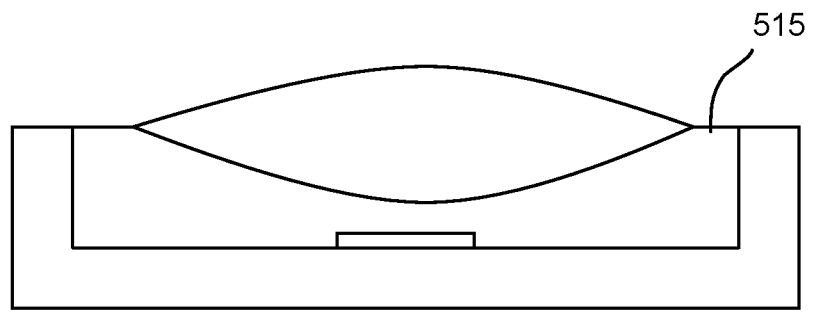
FIG. 15C is a diagram illustrating fluorescent layer shapes of another embodiment.

Please refer to FIG. 15A, FIG. 15B and FIG. 15C, which illustrate three different way to arrange the fluorescent layers.

In FIG. 15A, a first fluorescent layer 502 surrounds a LED module 503. A second fluorescent layer 501 is stacked on the first fluorescent layer 502. A package housing 504 is used for providing a container for the first fluorescent layer 502.

In FIG. 15B, similar to FIG. 15A, a LED module 512 is surrounded by a second fluorescent layer 512. A second fluorescent layer 511 is stacked on the first fluorescent layer 511.

In FIG. 15C, similar to FIG. 15B, an additional exposure of the first fluorescent layer 515 is arranged, instead of covering the first fluorescent layer 512 completely.

The intermediate surface between the first fluorescent layer 502 and the second fluorescent layer 501 is a convex surface, which may be used as a lens for guiding light to desired direction. For example, to adjust light beam angle, or mixing light of different colors.

The top surfaces of the first fluorescent layer and the second fluorescent layer may be concave lens or concave lens, for different optical requirements.

Figure 16A:
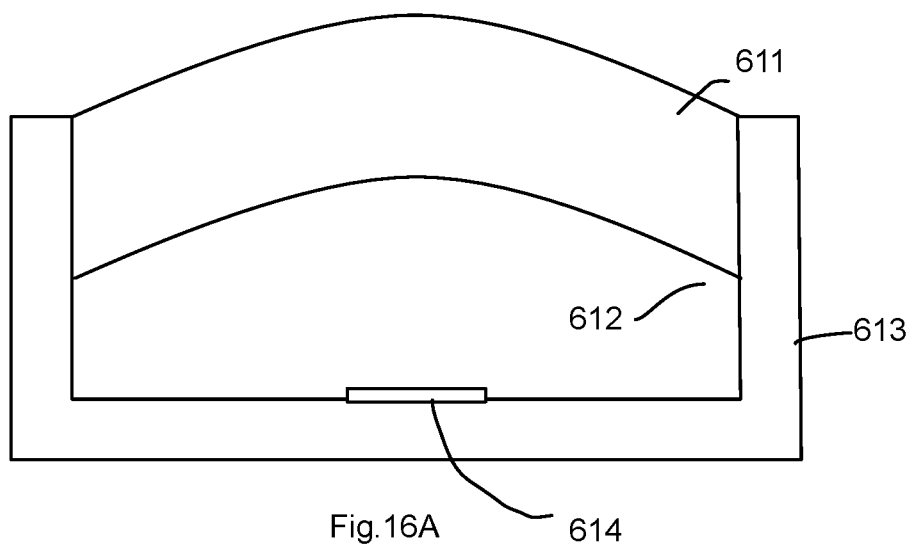
FIG. 16A is a diagram illustrating fluorescent layer curve surfaces of an embodiment.
Figure 16B:
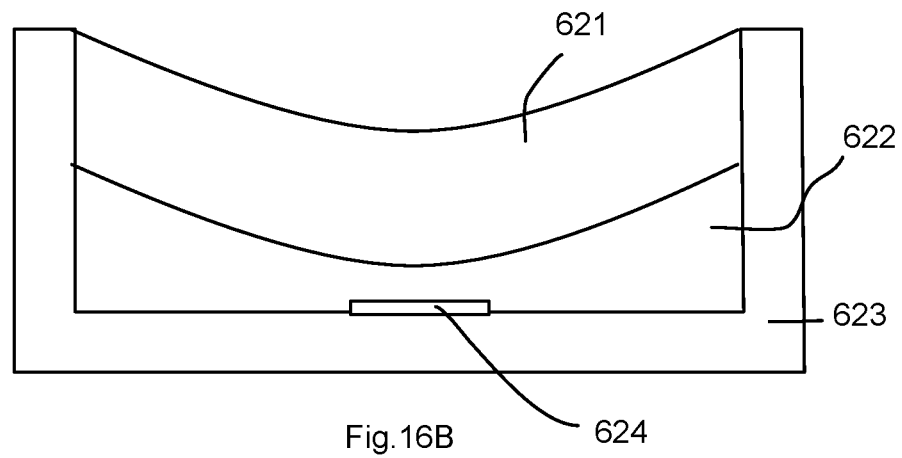
FIG. 16B is a diagram illustrating fluorescent layer curve surfaces of another embodiment.

Please refer to FIG. 16A and FIG. 16B.

In FIG. 16A, a LED module 614 is surrounded by a first fluorescent layer 612. A second fluorescent layer 611 is stacked on the first fluorescent layer 612. A package housing 613 provides a container for storing the first fluorescent layer 612.

In FIG. 16B, similarly, a LED module 624 is surrounded by a first fluorescent layer 622. A second fluorescent layer 621 is stacked on the first fluorescent layer 622. A package housing 623 provides a container for storing the first fluorescent layer 622.

As mentioned before, the curve surface combination may have various configuration to optimize light paths in corresponding light apparatus designs.

Figure 17A:
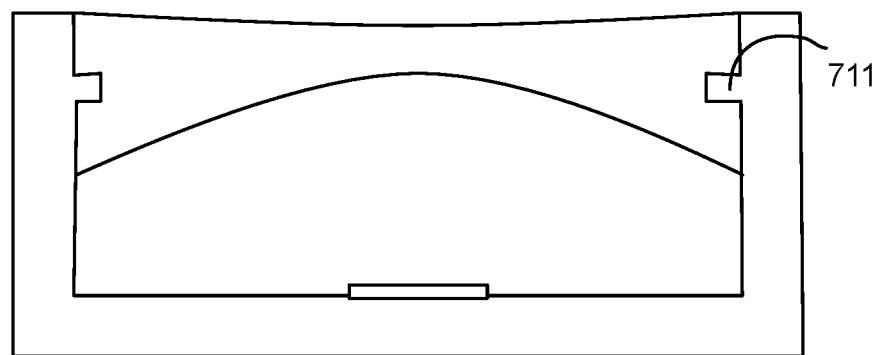
FIG. 17A illustrates an auxiliary fixing structure for fixing the fluorescent layer in an embodiment.
Figure 17B:
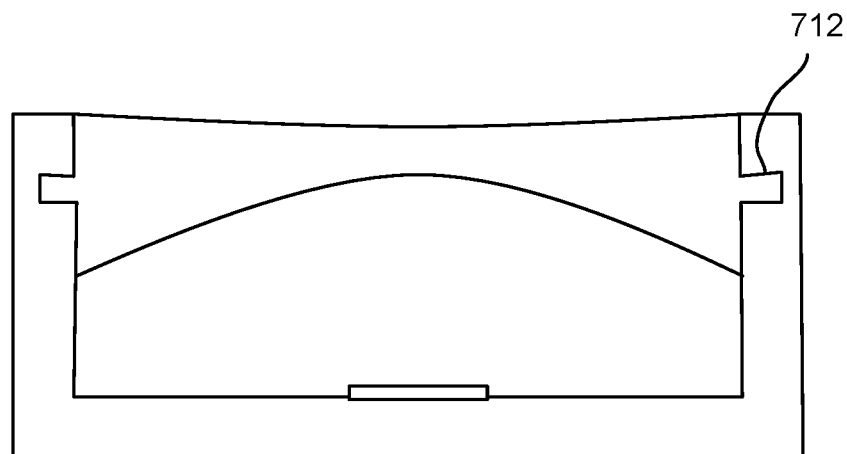
FIG. 17B illustrates an auxiliary fixing structure for fixing the fluorescent layer in another embodiment.

Please refer to FIG. 17A and FIG. 17B.

In FIG. 17A and FIG. 17B, a convex structure 711 and a concave structure 712 are respectively disposed for fixing the top fluorescent layer more reliably. Usually, the fluorescent layers are inserted to the package housing in gel mode after being heated.

It is not easy to control cooling timing, while attachment between fluorescent layers depend on status between adjacent fluorescent layers. With such designs, fluorescent layers in gel or liquid mode may fill or hook the concave structure 712 or the convex structure to better fix the fluorescent layers more firmly.

Figure 18:
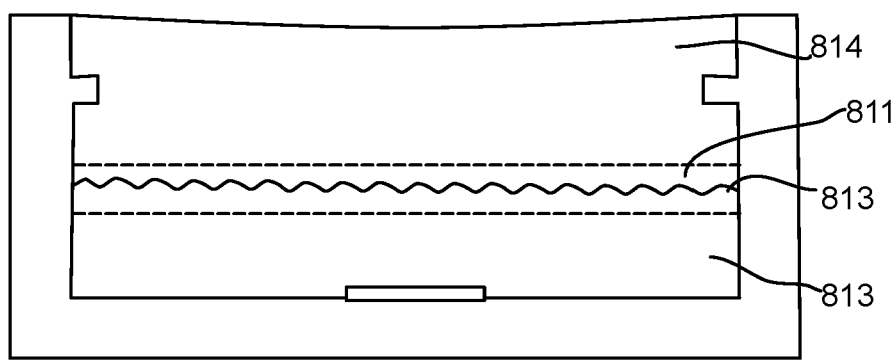
FIG. 18 illustrates an intermediate part between fluorescent layers.

Please refer to FIG. 18.

In FIG. 18, an intermediate part 811 exists between a first fluorescent layer 813 and a second fluorescent layer 814. The intermediate part 811 contains materials of both the first fluorescent layer 813 and the second fluorescent layer 814. For example, the first fluorescent layer 813 may contain red phosphor and the second fluorescent layer 814 may contain green phosphor. Both red and green phosphor exist in the intermediate part 811, which makes the overall light transmission better fitting to design needs.

In addition, the intermediate surface 813 between the first fluorescent layer 813 and the second fluorescent layer 814 may have a plurality of micro convex structures, serving as micro optical lens for guiding light transmission to better fit design requirements.

The thickness of the intermediate part 811 is less than 10% of the total thickness of the first fluorescent layer 813 and the second fluorescent layer 814.

Figure 19A:
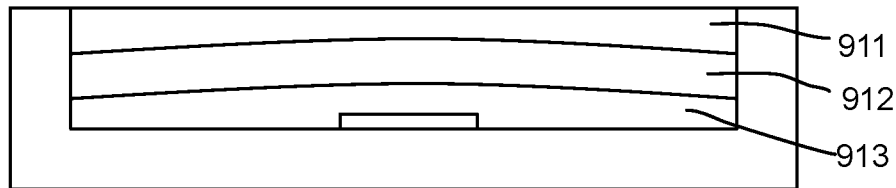
FIG. 19A illustrates another embodiment of a LED device.
Figure 19B:
FIG. 19B illustrates another embodiment of a LED device.
Figure 19C:
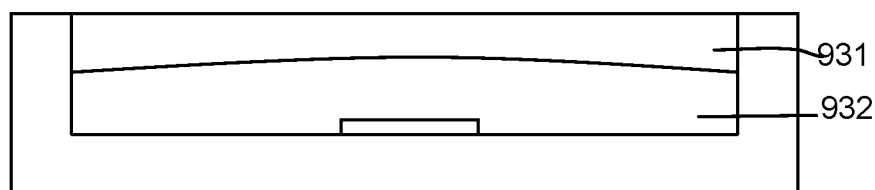
FIG. 19C illustrates another embodiment of a LED device.

Please refer to FIG. 19A, FIG. 19B and FIG. 19C.

In FIG. 19A, a LED device has three fluorescent layers. The first fluorescent layer 913 may contain red phosphor material. The second fluorescent layer 912 may contain green phosphor material and the third fluorescent layer 911 may contain blue phosphor material.

In FIG. 19B, a LED device has a first fluorescent layer 922 containing red phosphor material. The second fluorescent layer 921 may contain both green phosphor and blue phosphor material.

In FIG. 19C, a LED device has a first fluorescent layer 932 containing red phosphor and green phosphor material. The second fluorescent layer 931 contains blue phosphor material.

In the embodiments of FIG. 19A, FIG. 19B and FIG. 19C, the LED module may be an ultraviolet LED emitting light with frequency between 200 nm to 380 nm.

Figure 20A:
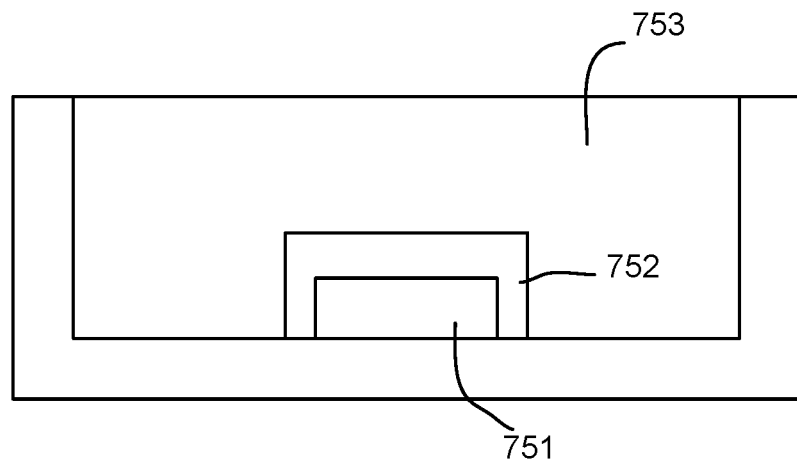
FIG. 20A illustrates another embodiment of a LED device.
Figure 20B:
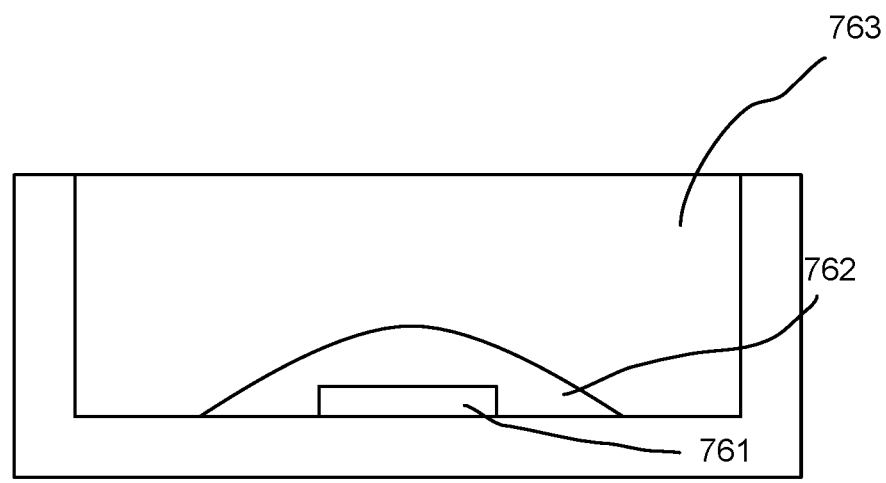
FIG. 20B illustrates another embodiment of a LED device.

Please refer to FIG. 20A and FIG. 20B.

In FIG. 20A, a LED device has a LED module 751 surrounded by an inverted U shape first fluorescent layer 752 that is further surrounded by a second fluorescent layer 753.

In FIG. 20B, a LED device has a LED module 761 surrounded by a dome shape first fluorescent layer 762 that is further surrounded by a second fluorescent layer 763.

Figure 21A:
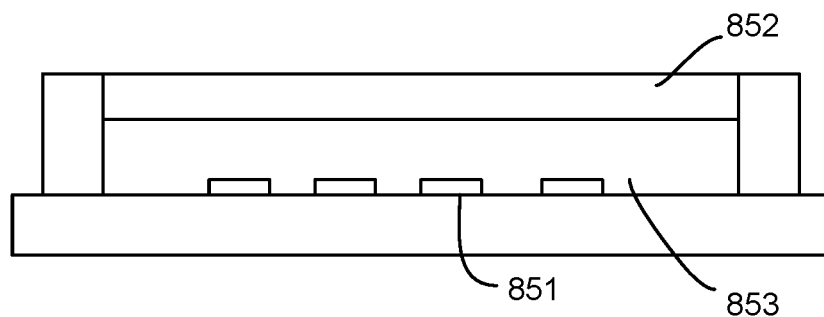
FIG. 21A illustrates another embodiment of a LED device.

Please refer to FIG. 21A, which illustrates a COB LED device, with LED chips 851 covered by a first fluorescent layer 853 and a second fluorescent layer 852.

Figure 21B:
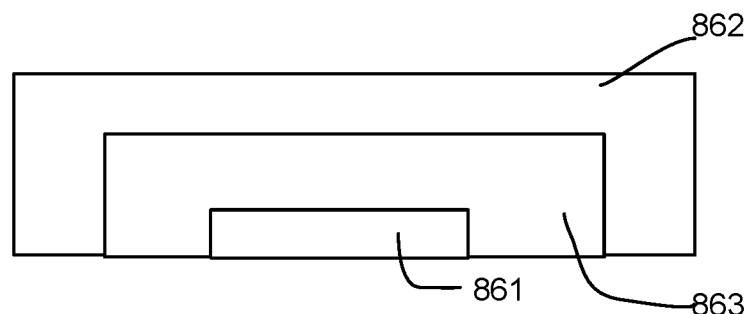
FIG. 21B illustrates another embodiment of a LED device.

Please refer to FIG. 21B, which illustrates a CSP LED device, with a LED die 861 surrounded by a first fluorescent layer 863 and a second fluorescent layer 862.

Figure 21C:
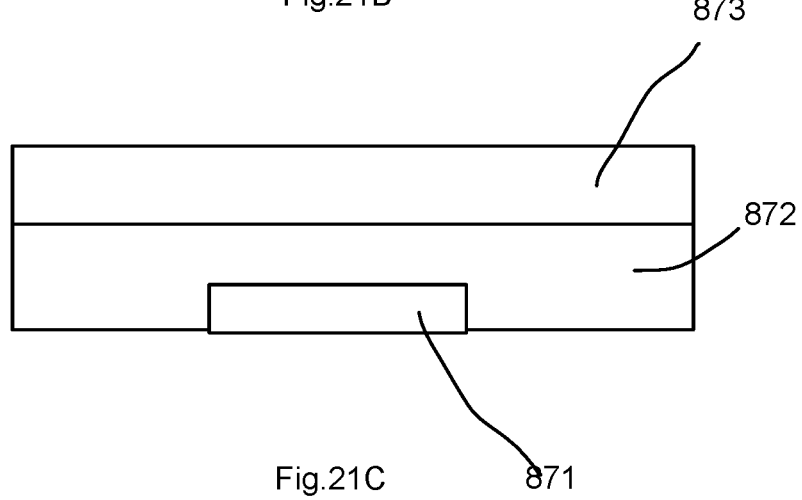
FIG. 21C illustrates another embodiment of a LED device.

Please refer to FIG. 21C, which illustrates another CSP LED device, with a LED die 871 surrounded by a first fluorescent layer 872 and a second fluorescent layer 873.

Please note that the different arrangement and shapes of the fluorescent layers, which teaches persons of ordinary skilled in the art to perform even other variations, which should be still regarded as within the inventive scope.

Figure 22A:
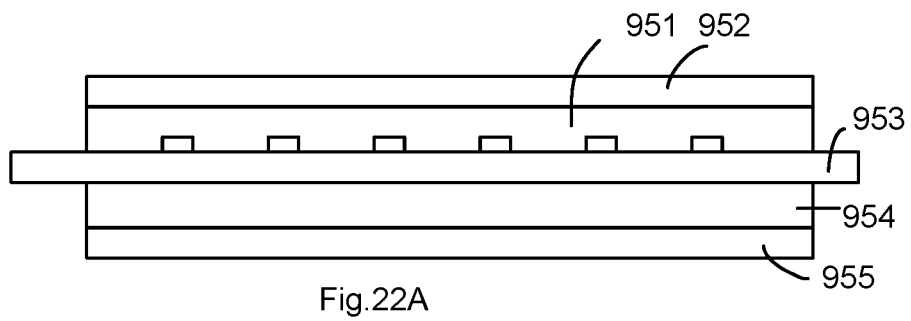
FIG. 22A illustrates another embodiment of a LED device.

Please refer to FIG. 22A, which illustrates a LED device with a strip substrate 953 having two surfaces covered by a fluorescent layers 951, 952, 953 and 954.

Figure 22B:
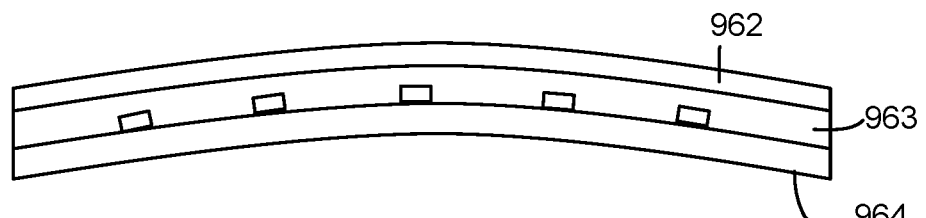
FIG. 22B illustrates another embodiment of a LED device.

Please refer to FIG. 22B, which illustrates a LED device with a substrates 964 as a flexible circuit board substrate with fluorescent layers 962 and 963 covered thereon.

The several embodiments mentioned above may be applied with desired combination of previously mentioned fluorescent layer features.

Figure 23A:
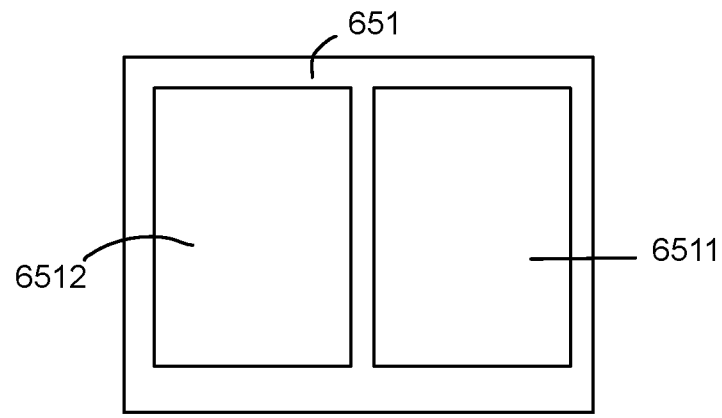
FIG. 23A illustrates another embodiment of a LED device.
Figure 23B:
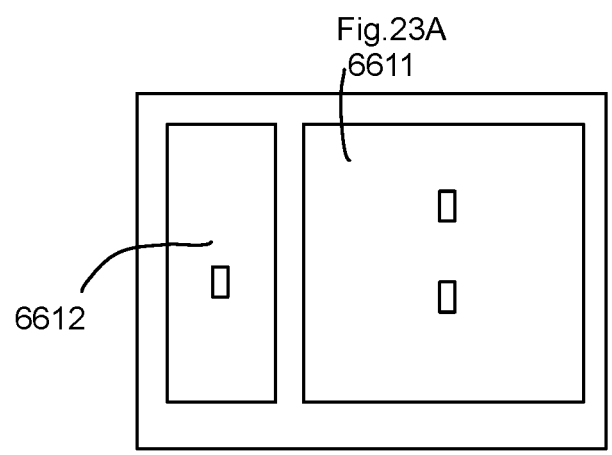
FIG. 23B illustrates another embodiment of a LED device.
Figure 23C:
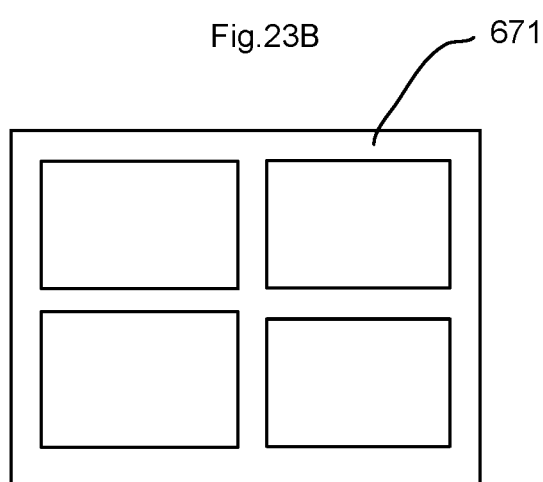
FIG. 23C illustrates another embodiment of a LED device.

Please refer to FIG. 23A, FIG. 23B and FIG. 23C.

In addition to stack fluorescent layers, the fluorescent layers may be placed in the same level.

In FIG. 23A, a packaging housing 651 defines two containers 6512 and 6511 for containing two fluorescent layers mentioned above.

FIG. 23B further illustrates that the two containers 6611, 6612 may have different size in response to different luminous output of different colors. Corresponding numbers of LED chips may be provided for such design requirement, too.

FIG. 23C show an interleaved arrangement of different color fluorescent layers. Other interleaved patterns may be used.

Figure 24:
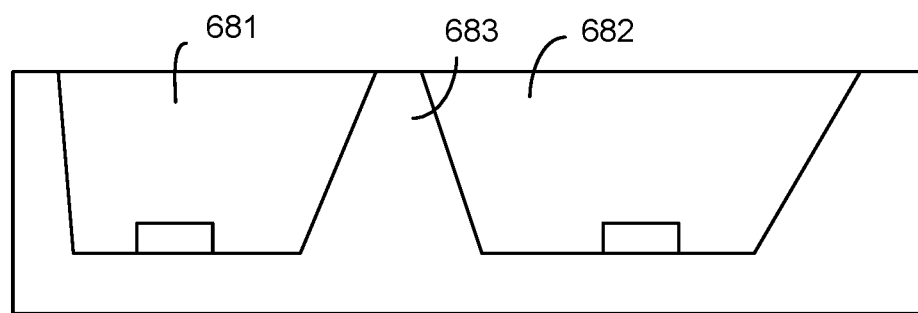
FIG. 24 illustrates another embodiment of a LED device.

Please refer to FIG. 24, which illustrates a LED device having a first fluorescent layer 681 and a second fluorescent layer 682. A separating component 683 is provided to prevent light from the second fluorescent layer 682 to emit back to the first fluorescent layer 681.

Reflecting surfaces may even be provided to further optimize the overall output.

Figure 25:
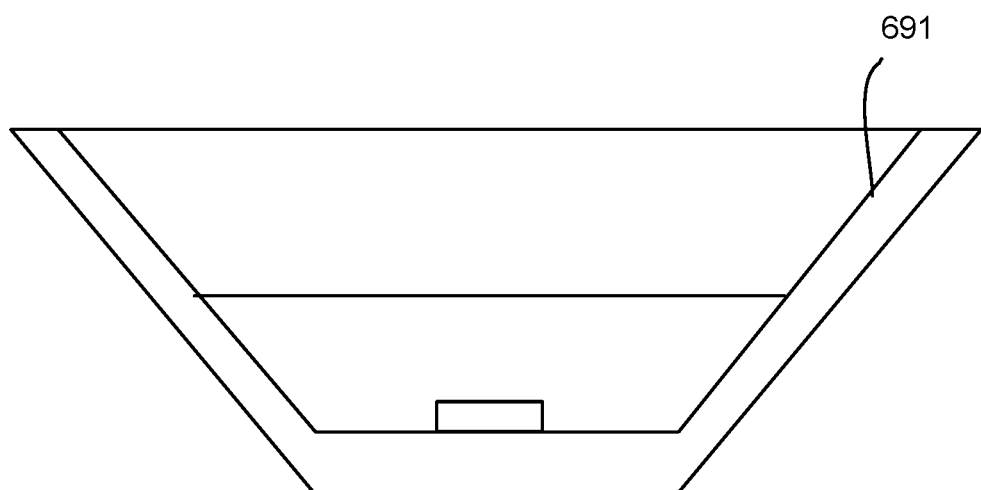
FIG. 25 illustrates another embodiment of a LED device.

Please refer to FIG. 25, which illustrates a LED device with a package side wall 691 having a tilt angle. In such design, light from the top fluorescent layer may have less chance to emit back to the bottom fluorescent layer, causing better luminous efficacy and CRI as mentioned above.

In addition to the above-described embodiments, various modifications may be made, and as long as it is within the spirit of the same invention, the various designs that can be made by those skilled in the art are belong to the scope of the present invention.

The invention claimed is:

1. A LED device, comprising:
   a LED module comprising a plurality of LED components mounted on a substrate for emitting an original light of an original spectrum;
   a first fluorescent layer surrounding the plurality of LED components for converting the original light to a first output light of a first spectrum;
   a second fluorescent layer stacked on the first fluorescent layer for converting the original light not absorbed by the first fluorescent layer and entering the second fluorescent layer to generate a second output light of a second spectrum,
   wherein the substrate is a transparent elongated strip, and
   wherein there is an intermediate part between the first fluorescent layer and the second fluorescent layer, the intermediate part comprising mixed materials of the first fluorescent layer and the second fluorescent layer, and the intermediate part has a plurality of micro convex structures between the first fluorescent layer and the second fluorescent layer.

2. The LED device of claim 1, wherein the first fluorescent layer is a dome shape and the second fluorescent layer and the substrate surround the first fluorescent layer.

3. The LED device of claim 1, further comprising a package housing, wherein the package housing and the substrate form a container for storing the first fluorescent layer.

4. The LED device of claim 3, wherein the package housing has a surrounding side wall with larger peripheral size at top than at bottom.

5. The LED device of claim 3, wherein the package housing has a surrounding side wall with a reflecting surface facing to the first fluorescent layer.

6. The LED device of claim 1, wherein a heat dissipation material is mixed in the first fluorescent layer.

7. The LED device of claim 1, wherein the first fluorescent layer and the second fluorescent layer have phosphor material, and the phosphor material has larger density near bottom than top in the first fluorescent layer and the second fluorescent layer.

8. The LED device of claim 1, further comprising a package housing, wherein the package housing has a side wall with a convex structure engaging the first fluorescent layer.

9. The LED device of claim 1, further comprising a package housing, wherein the package housing has a side wall with a concave structure engaging the first fluorescent layer.

10. The LED device of claim 1, wherein the first fluorescent layer has a first convex surface on top of the first fluorescent layer, the second fluorescent layer has a second convex surface on top of the second fluorescent layer.

11. The LED device of claim 10, wherein the first convex surface and the second convex surface forming lens guiding the first output light and the second output light for mixing the first output light and the second output light.

12. The LED device of claim 1, wherein the first fluorescent layer has a first concave surface on top of the first fluorescent layer, the second fluorescent layer has a second concave surface on top of the second fluorescent layer.

13. The LED device of claim 1, wherein an intermediate surface between the first fluorescent layer and the second fluorescent layer is a convex curve surface.

14. The LED device of claim 1, wherein an intermediate surface between the first fluorescent layer and the second fluorescent layer is a concave curve surface.

15. The LED device of claim 1, wherein the first output light, the second light and the original light not absorbed by the first fluorescent layer and the second fluorescent layer form an overall output spectrum of a white light.

16. The LED device of claim 15, wherein the first fluorescent layer and the second fluorescent layer both comprise red phosphor material for generating 640-650 nm output light.

17. The LED device of claim 15, wherein the first fluorescent layer and the second fluorescent layer both comprise red phosphor material for generating 628-635 nm output light.

18. The LED device of claim 1, wherein the original spectrum is substantially corresponding to a ultraviolet light, the second fluorescent layer comprises green phosphor material and blue phosphor material for generating a green light and a blue light, the first fluorescent layer comprises red phosphor material for generating a red light.

19. The LED device of claim 1, further comprising a third fluorescent layer having blue phosphor material for generating blue light spectrum, wherein the second fluorescent layer comprises green phosphor material for generating a green light, and the first fluorescent layer comprises red phosphor material for generating a red light.

20. The LED device of claim 1, wherein the first fluorescent layer comprises red phosphor material and green phosphor material for generating a red light and a green light and the second fluorescent layer comprises blue phosphor material for generating a blue light.

* * * * *